US012728945B2

(12) United States Patent
Cheng et al.

(10) Patent No.: US 12,728,945 B2
(45) Date of Patent: Sep. 8, 2026

(54) METHOD AND SYSTEM FOR ESTIMATING POWER CONSUMPTION AND TIME CONSUMPTION OF ELECTRIC ASSISTED BICYCLE

(71) Applicants: Acer Incorporated, New Taipei City (TW); Acer Gadget Inc., Taipei City (TW)

(72) Inventors: Yung-Yuan Cheng, New Taipei City (TW); Chih-Yuan Chang, Taipei City (TW); Jun-An Lin, Taipei City (TW); Yueh-Yarng Tsai, New Taipei City (TW); Yun-Hsuan Chan, New Taipei City (TW); Chih-Wei Tu, New Taipei City (TW); Ke-Han Pan, New Taipei City (TW)

(73) Assignees: Acer Incorporated, New Taipei City (TW); Acer Gadget Inc., Taipei City (TW)

( * ) Notice: Subject to any disclaimer, the term of this patent is extended or adjusted under 35 U.S.C. 154(b) by 0 days.

(21) Appl. No.: 19/071,703

(22) Filed: Mar. 5, 2025

(65) Prior Publication Data

US 2025/0282440 A1 Sep. 11, 2025

(30) Foreign Application Priority Data

Mar. 6, 2024 (TW) ................................ 113108105

(51) Int. Cl.
*B62J 50/22* (2020.01)
*G01C 21/00* (2006.01)
(Continued)

(52) U.S. Cl.
CPC .......... *B62J 50/22* (2020.02); *G01C 21/3469* (2013.01); *G01C 21/3826* (2020.08); *G01R 21/133* (2013.01)

(58) Field of Classification Search
CPC .. B62J 50/22; G01C 21/3469; G01C 21/3826; G01R 21/133
See application file for complete search history.

(56) References Cited

U.S. PATENT DOCUMENTS

2023/0384106 A1 * 11/2023 Fanning .................. B62J 45/20

FOREIGN PATENT DOCUMENTS

CN 111183459 5/2020
CN 120252769 A * 7/2025 ......... G01C 21/3469
(Continued)

OTHER PUBLICATIONS

KR-20220015527-A English machine translation (Year: 2022).*
(Continued)

*Primary Examiner* — Dale Moyer
(74) *Attorney, Agent, or Firm* — JCIPRNET

(57) ABSTRACT

A method and a system for estimating power consumption and time consumption of electric assisted bicycle are provided. The method including the following steps. A start location and a destination location are received. A planned route is generated according to the starting location and the destination location. A riding time consumed by the electric assisted bicycle to travel the planned route is estimated according to route information of the planned route and riding habit information of a rider. A power consumption consumed by the electric assisted bicycle to travel the planned route is estimated according to the riding time, the route information and the riding habit information. The riding time and the power consumption associated with a first riding mode are displayed through a user operation interface.

20 Claims, 7 Drawing Sheets

(51) Int. Cl.
*G01C 21/34* (2006.01)
*G01R 21/133* (2006.01)

(56) References Cited

FOREIGN PATENT DOCUMENTS

| | | | | | |
|---|---|---|---|---|---|
| IN | 202041042948 A | * | 4/2022 | ................ | B62J 1/00 |
| KR | 20220015527 A | * | 2/2022 | ............. | B62J 50/22 |
| TW | 202001592 | | 1/2020 | | |

OTHER PUBLICATIONS

Burani, Erik, Giacomo Cabri, and Mauro Leoncini. “An algorithm to predict e-bike power consumption based on planned routes.” Electronics 11.7 (2022): 1105. (Year: 2022).*

* cited by examiner

METHOD AND SYSTEM FOR ESTIMATING POWER CONSUMPTION AND TIME CONSUMPTION OF ELECTRIC ASSISTED BICYCLE

CROSS-REFERENCE TO RELATED APPLICATION

This application claims the priority benefit of Taiwan application serial no. 113108105, filed on Mar. 6, 2024. The entirety of each of the above-mentioned patent applications is hereby incorporated by reference herein and made a part of this specification.

BACKGROUND

Technical Field

The disclosure relates to an electric-assisted bicycle, and in particular to a method and system for estimating power consumption and time consumption of an electric-assisted bicycle.

Description of Related Art

For different purposes such as environmental protection, health, leisure or economy, bicycle riding has become increasingly popular in modern society. Generally speaking, when riding a conventional bicycle, the rider needs to propel the bicycle forward entirely by pedaling. In contrast, electric-assisted bicycles are becoming more and more popular because they require less effort to ride due to the electric power assistance they provide. It is known that if the battery of an electric-assisted bicycle is exhausted, it will be no different from a regular conventional bicycle as the motor will not be able to provide assistance to the rider. Therefore, riders generally need to ensure that electric-assist bicycles have enough battery power to reach their destination. The safest practice is to charge the electric-assist bicycle's battery to full capacity. However, in many situations, riders may encounter difficulty accurately confirming whether the electric-assist bicycle has sufficient battery power to reach their destination. Additionally, different riding styles can result in varying levels of power consumption, making it quite inaccurate to rely solely on distance traveled to estimate battery usage.

SUMMARY

The disclosure provides a method and system for estimating power consumption and time consumption of an electric-assisted bicycle, which can solve the above technical problems.

The disclosure proposes a method for estimating power consumption and time consumption of an electric-assisted bicycle, which includes the following steps. A starting location and a destination location are received. A planned route is generated based on the starting location and destination location. A riding time required for the electric-assisted bicycle to travel along the planned route is estimated based on route information of the planned route and riding habit information of a rider. A power consumption of the electric-assisted bicycle traveling along the planned route is estimated based on the riding time, the route information, and the riding habit information. The riding time and the power consumption associated with a first riding mode are displayed through a user operation interface.

The disclosure proposes a system for estimating power consumption and time consumption of an electric-assisted bicycle, which includes a storage device and a processor. The processor is coupled to the storage device and configured to perform the following operations. A starting location and a destination location are received. A planned route is generated based on the starting location and destination location. A riding time required for the electric-assisted bicycle to travel along the planned route is estimated based on route information of the planned route and riding habit information of a rider. A power consumption of the electric-assisted bicycle traveling along the planned route is estimated based on the riding time, the route information, and the riding habit information. The riding time and the power consumption associated with a first riding mode are displayed through a user operation interface.

Based on the above, in the embodiment of the disclosure, the riding time and the power consumption of the electric-assisted bicycle traveling along the planned route can be accurately estimated based on the route information of the planned route and the riding habit information of a rider, so as to allow the rider to accurately determine whether the remaining battery level of the electric-assisted bicycle is sufficient. Based on this, riders can more conveniently plan and schedule their riding trips, while reducing the occurrence of situations where they are unable to reach their destination effortlessly due to insufficient battery power.

DESCRIPTION OF THE EMBODIMENTS

Some embodiments of the disclosure will be described in detail with reference to the accompanying drawings. The component symbols cited in the following description will be regarded as the same or similar components when the same component symbols appear in different drawings. These embodiments are only part of the disclosure and do not disclose all possible implementations of the disclosure. Rather, these embodiments are only examples within the scope of the patent application of the invention.

Figure 1:
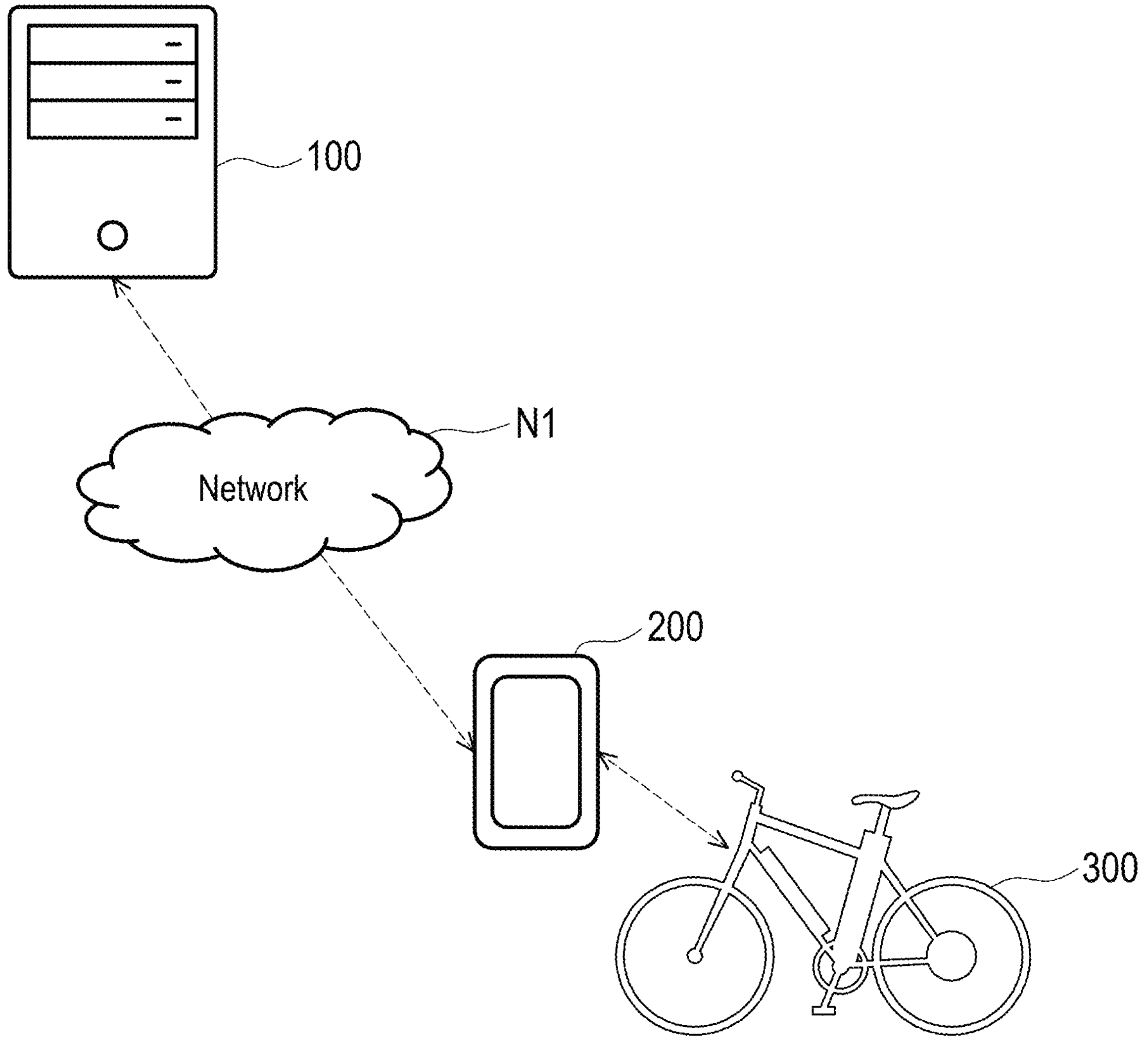
FIG. 1 is a schematic diagram of a system for estimating power consumption and time consumption of an electric-assisted bicycle according to an embodiment of the disclosure.
Figure 2:
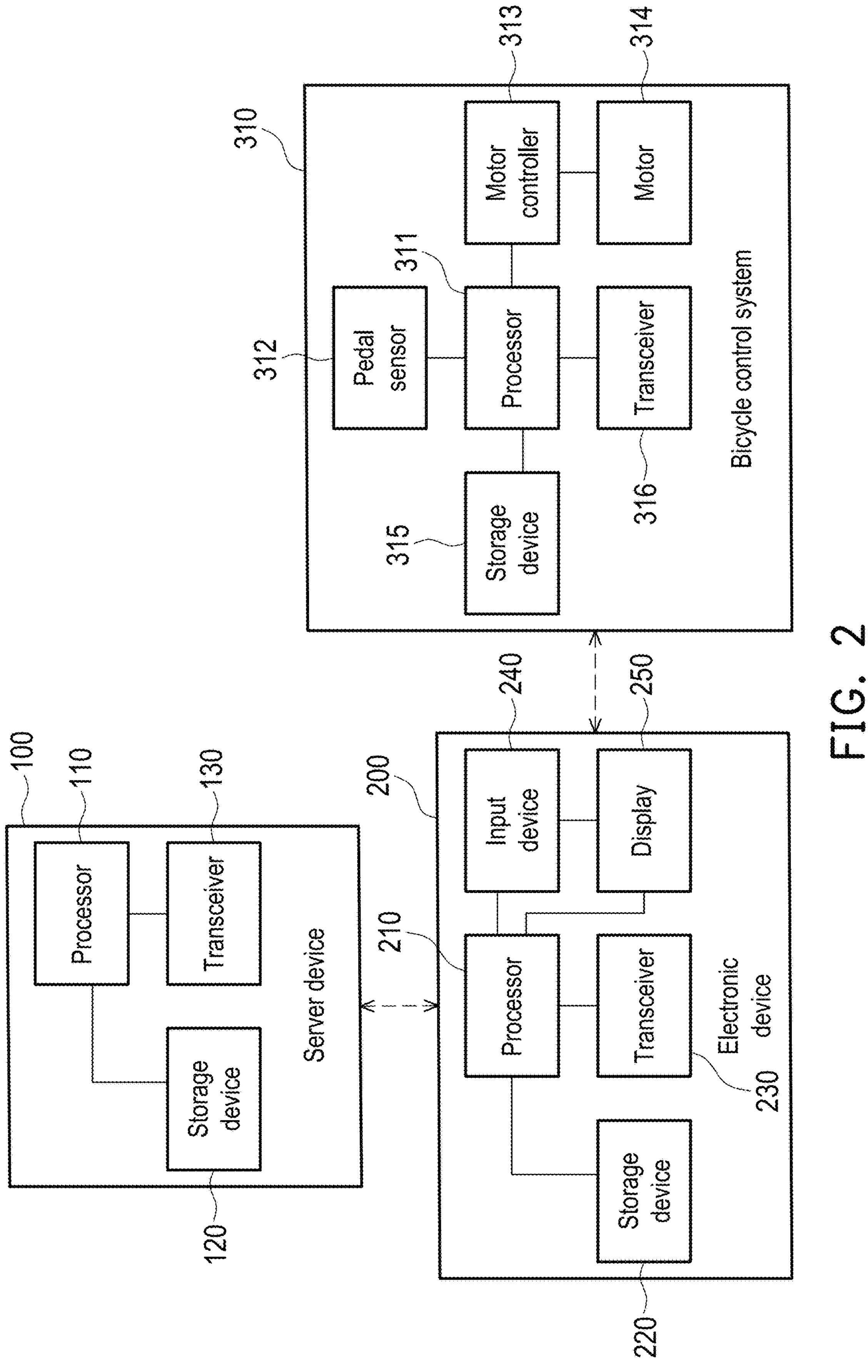
FIG. 2 is a block diagram of a system for estimating power consumption and time consumption of an electric-assisted bicycle according to an embodiment of the disclosure.

Referring to FIG. 1 and FIG. 2, FIG. 1 is a schematic diagram of a system for estimating power consumption and time consumption of an electric-assisted bicycle according to an embodiment of the disclosure. FIG. 2 is a block diagram of a system for estimating power consumption and time consumption of an electric-assisted bicycle according to an embodiment of the disclosure.

The system 10 for estimating power consumption and time consumption of an electric-assisted bicycle includes a server device 100, an electronic device 200, and an electric-assisted bicycle 300. The server device 100 may be connected to the electronic device 200 via a network N1. The electronic device 200 may establish a communication connection with a bicycle control system 310 of the electric-assisted bicycle 300. For example, the electronic device 200 may establish a Bluetooth connection with the bicycle control system 310 of the electric-assisted bicycle 300.

Network N1 may include any combination of public and/or private networks, local networks and/or wide area networks, etc. In addition, network N1 may utilize one or more wired and/or wireless communication technologies. In some embodiments, network N1 may include, for example, a cellular or other mobile network, a wireless local area network (WLAN), a wireless wide area network (WWAN), and/or an Internet network. Examples of network N1 include Long Term Evolution (LTE) wireless networks, fifth generation (5G) wireless networks (also known as New Radio (NR) wireless networks or 5G NR wireless networks), Wi-Fi WLANs, and Internet networks.

The server device 100 is an electronic device with data storage capabilities, computing capabilities and network connecting capabilities. Server device 100 may include (but is not limited to) a storage device 120, a transceiver 130, and a processor 110. The storage device 120 is configured to store data, instructions, software modules or programs. The processor 110 may access and execute instructions, software modules or programs in the storage device 120. The transceiver 130 is configured to connect to network N1 to receive and transmit data. In some embodiments, the server device 100 may be implemented by one or more cloud servers of a cloud computing platform. The cloud computing platform may be any cloud computing platform known in the art, such as Amazon Web Services (AWS), Microsoft Azure, GOOGLE CLOUD or other cloud computing platforms.

The electronic device 200 is, for example, a smartphone, a smart watch, a wearable electronic device or other user terminal devices. The electronic device 200 may include (but is not limited to) a processor 210, a storage device 220, a transceiver 230, an input device 240, and a display 250. The storage device 220 is configured to store data, instructions, software modules or programs. The processor 210 may access and execute instructions, software modules or programs in the storage device 220. The transceiver 230 may include a transceiver circuit for connecting to the network N1 to receive and transmit data, and a transceiver circuit for connecting to the bicycle control system 310. The input device 240 is, for example, a touch screen or a button, and is configured to receive rider operations. The display 250 is configured to display the user operation interface of the application program.

The electric-assist bicycle 300 is a type of transportation that combines human pedaling and electric power assistance. When the rider pedals the pedals of the electric-assist bicycle 300, the electric-assist bicycle 300 can provide assistance to the rider, allowing the rider to drive the tires of the electric-assist bicycle 300 more effortlessly. The power-assisted bicycle 300 includes a bicycle control system 310. The bicycle control system 310 includes a processor 311, a pedal sensor 312, a motor controller 313, a motor 314, a storage device 315, and a transceiver 316. In addition, the electric-assisted bicycle 300 also includes a rechargeable battery (not shown), such as a lithium battery, that provides power to the motor 314.

The pedaling sensor 312 is configured to sense the pedaling state of the rider. For example, the pedaling sensor 312 may include a cadence sensor and a torque sensor. The torque sensor may be configured to sense the force applied by the rider on the pedals. The cadence sensor may be configured to sense the pedaling frequency of the rider. The motor controller 313 may be configured to control the start, stop, rotation speed, steering and other operations of the motor 314. The motor 314 is configured to provide the driving torque required for the electric-assisted bicycle 300 to move forward to drive at least one wheel of the electric-assisted bicycle 300. The storage device 315 is configured to store data, instructions, software modules or programs. The processor 310 may access and execute instructions, software modules or programs in the storage device 315, and the processor 310 may monitor and control the operating status of the entire electric-assisted bicycle 300. The transceiver 316 is configured to connect to the electronic device 200 to receive and transmit data.

The processors 110, 210, and 311 are, for example, central processing units (CPUs), application processors, or other programmable general-purpose or special-purpose microprocessors (Microprocessors), digital signal processors (Digital Signal Processors, DSPs)), programmable controller, Application Specific Integrated Circuits (ASIC), Programmable Logic Device (PLD) or other similar devices or a combination of these devices, which may execute storage device respectively 120, 220, 315 instructions, software modules or programs.

Figure 3:
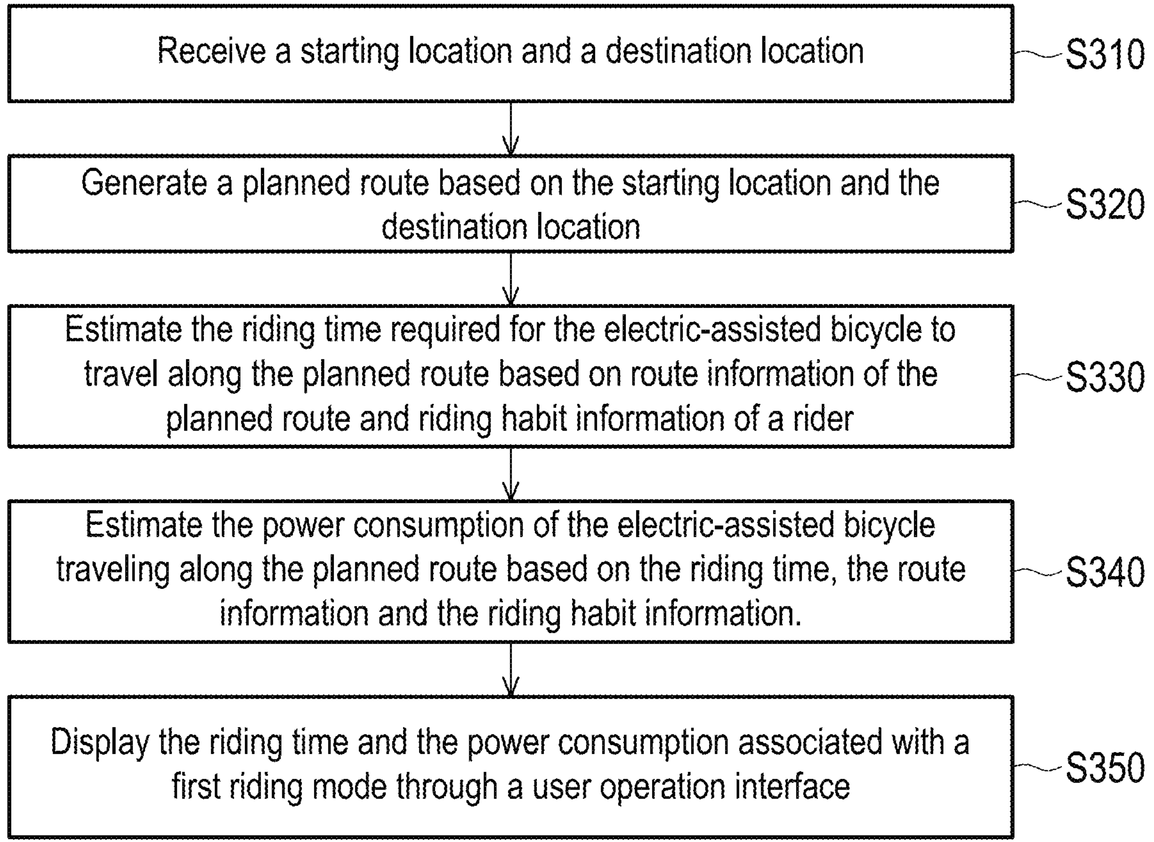
FIG. 3 is a flowchart of a method for estimating power consumption and time consumption of an electric-assisted bicycle according to an embodiment of the disclosure.

FIG. 3 is a flowchart of a method for estimating power consumption and time consumption of an electric-assisted bicycle according to an embodiment of the disclosure. Referring to FIG. 1 and FIG. 3, the following is a description of the steps of the method for estimating power consumption and time consumption of an electric-assisted bicycle in this embodiment in conjunction with the components of FIG. 1.

In step S310, the server device 100 receives a starting location and a destination location. Specifically, the electronic device 200 may receive the starting position and destination position set by the rider through the input device 240, and may transmit the starting position and destination position set by the rider to server device 100 through the network N1.

In step S320, the server device 100 generates a planned route based on the starting location and the destination location. The server device 100 may create a planned route based on the map data provided by the map server. Alternatively, the server device 100 may provide the starting position and the destination position to a navigation server that provides navigation services to obtain the planned route.

In step S330, the server device 100 estimates a riding time required for the electric-assisted bicycle 300 to travel along the planned route based on the route information of the planned route and riding habit information of a rider. The route information of the planned route may include route distance, terrain height change, slope value, traffic light information or number of intersections, etc. The riding habit information may be obtained based on the rider's historical riding record data. The riding habit information may include riding speeds and motor assist parameters corresponding to different slope values. In some embodiments, motor assist parameters may include a maximum assist power, an assist Ratio Percentage and other motor control parameters. The maximum assist power is a parameter configured to limit the maximum assist force of the motor 314. The assist ratio represents the ratio between the assist provided by motor 314 and human pedaling.

In some embodiments, the server device 100 may estimate the riding time by inputting the route information of the planned route and the riding habit information of the rider into a specific function. For example, the rider's average riding speed may be calculated based on the rider's riding record. The server device 100 may calculate an initial riding time based on the route distance and the average riding speed of the rider, and then adjust the initial riding time based on terrain height changes, slope values, traffic light information or the number of intersections to obtain the final estimated riding time.

In some embodiments, the server device 100 may input the route information of the planned route and the rider's riding habit information into a machine learning model to estimate the riding time required for the electric-assisted bicycle 300 to travel along the planned route. The machine learning model is, for example, a linear regression model, a neural network model, a support vector machine (support vector machine) model, etc. This machine learning model may be established based on training data and machine learning algorithms, and the input features of this machine learning model may include route information of the planned route and riding habit information of the rider. Training data may be generated by collecting actual riding data from multiple test riders riding the electric-assist bicycle through various test routes. The training data may include route information of multiple test routes, riding habit information of the test riders, and actual riding times for multiple test routes. The model parameters of the trained machine learning model can be stored in the storage device 120 of the server device 100. The model parameters determined through machine learning algorithms may include regression coefficients or weight values of linear regression models, etc.

In step S340, the server device 100 estimates a power consumption of the electric-assisted bicycle 300 traveling along the planned route based on the riding time, the route information and the riding habit information.

In some embodiments, the server device 100 may estimate power consumption by inputting riding time, route information, and riding habit information into a specific function. It may be seen that the riding time is positively correlated with the power consumption, and the output power of the motor 314 is positively correlated with the power consumption. For example, the motor assist parameter in the riding habit information may be configured to estimate the output power of the motor 314. Based on the output power and riding time of the motor 314, the server device 100 may calculate an initial power consumption. In addition, the server device 100 may adjust the initial power consumption according to terrain height changes, slope values, traffic light information or the number of intersections to obtain the final estimated power consumption.

In some embodiments, the server device 100 may input the riding time, the route information and the riding habit information into a machine learning model to estimate the power consumption of the electric-assisted bicycle 300 traveling along the planned route. The machine learning model is, for example, linear regression models, neural network models, or support vector machine models, etc. This machine learning model may be established based on training data and machine learning algorithms, and the input features of this machine learning model may include the riding time, the route information and the riding habit information. Training data may be generated by collecting actual riding data from multiple tester riders riding electric-assist bicycle through various test routes. The training data may include route information, riding time, and an actual power consumption for multiple test routes, and riding habit information of the test riders. The model parameters of the trained machine learning model can be stored in the storage device 120 of the server device 100. The model parameters determined through machine learning algorithms may include regression coefficients or weight values of linear regression models, etc.

In step S350, the electronic device 200 displays the riding time and power consumption associated with a first riding mode through the user operation interface. The riding time and power consumption associated with the first riding mode are displayed through the user operation interface. That is, the server device 100 may transmit the estimated riding time and the estimated power consumption to the electronic device 200 via the network N1. The estimated riding time and the estimated power consumption are provided to the rider through the user operation interface displayed by the electronic device 200. As a result, the rider can determine the riding time and power consumption required to reach the destination by riding the electric-assist bicycle 300 using the first riding mode. This enables the rider to confirm whether the remaining battery level of the electric-assist bicycle 300 is sufficient and facilitates planning their riding schedule.

Figure 4:
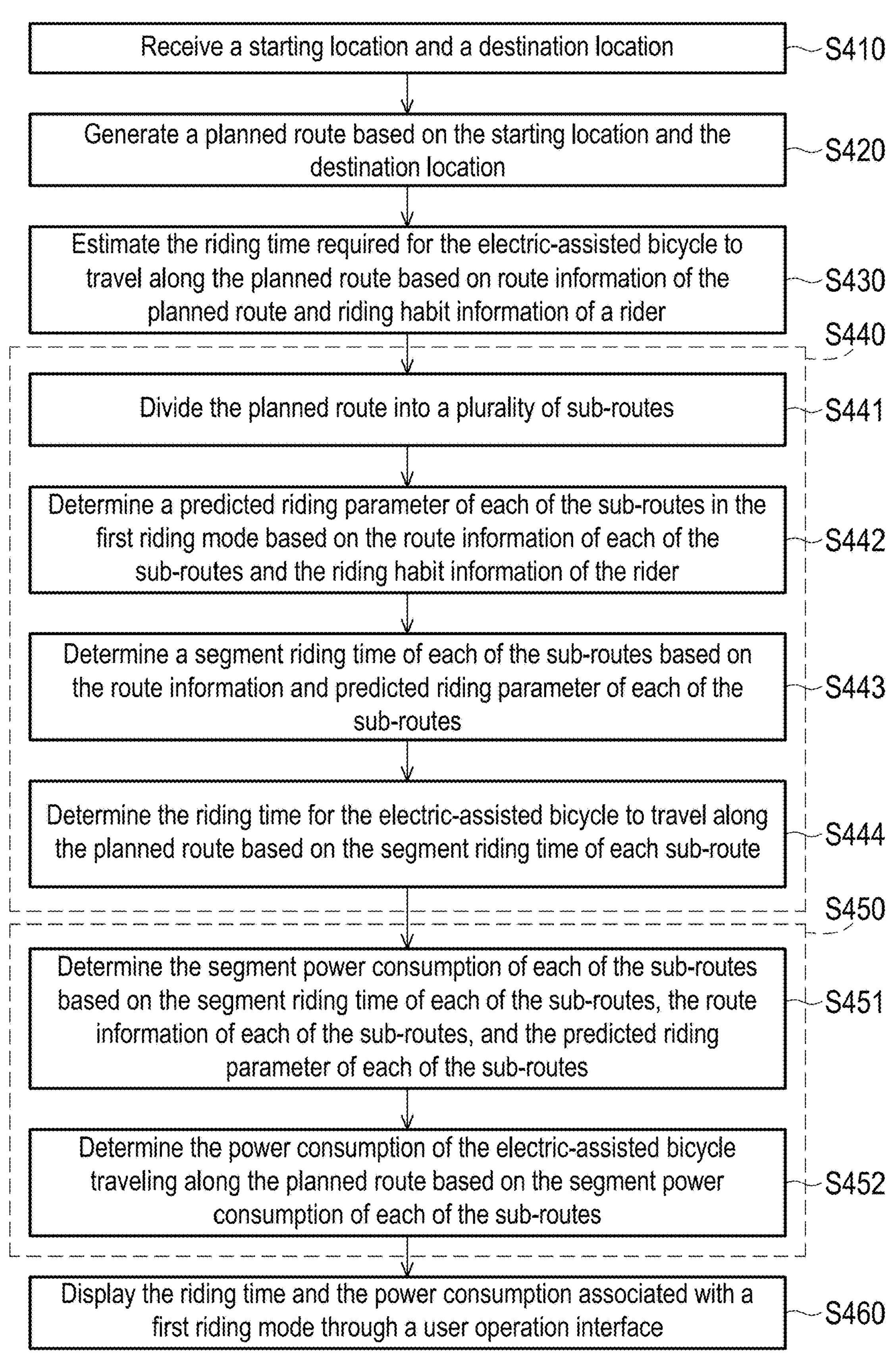
FIG. 4 is a flowchart of a method for estimating power consumption and time consumption of an electric-assisted bicycle according to an embodiment of the disclosure.

FIG. 4 is a flowchart of a method for estimating power consumption and time consumption of an electric-assisted bicycle according to an embodiment of the disclosure. Referring to FIG. 1 and FIG. 4, the method of the embodiment is applicable to the system 10 in the above embodiment. The following describes detailed steps of the embodiment in connection with various elements in the system 10.

In step S410, the server device 100 may collect riding habit information of a rider. The riding habit information includes a plurality of riding speeds respectively corresponding to a plurality of slope values and a plurality of motor assist parameters respectively corresponding to the slope values. Specifically, During the actual riding process of the rider riding the electric-assisted bicycle 300, the electric-assisted bicycle 300 may periodically report the rider's riding data and the motor parameters of the motor 314 to the server device 100. The above riding data may include riding speed, cadence, GPS location, etc. The above motor parameters may include the average torque, average output power or average current of the motor 314, etc. The server device 100 can obtain the slope values of multiple road segments based on these GPS locations and terrain data, and can calculate the average riding speeds respectively corresponding to these road segments. The server device 100 can also calculate the average riding speed, motor assistance parameters, and other motor parameters corresponding to the same slope value. For example, based on the rider's riding data, the server device 100 can obtain the first riding speed and the first motor assistance parameter corresponding to the first slope value, and obtain the second riding speed and the second motor assistance parameter corresponding to the second slope value.

In step S420, the server device 100 may receive a starting location and a destination location. In step S430, the server device 100 may generate a planned route based on the starting location and the destination location. Steps S420 to step S430 may be described with reference to the foregoing embodiments, and will not be described again here.

In step S440, the server device 100 may estimate the riding time required for the electric-assisted bicycle 300 traveling along the planned route based on the route information of the planned route and the riding habit information of the rider. In some embodiments, step S440 may be implemented as step S441 to step S444.

In step S441, the server device 100 may divide the planned route into multiple sub-routes. In some embodiments, the server device 100 may divide the planned route into multiple sub-routes based on a fixed distance (such as 200 meters, etc.), that is, the route distances of these sub-routes are the same. Alternatively, in some embodiments, the server device 100 may divide the planned route into multiple sub-routes corresponding to different slope values based on the slope information of the planned route, that is, the route distances of these sub-routes may be different.

In step S442, the server device 100 may determine a predicted riding parameter of each of the sub-routes in the first riding mode based on the route information of each of the sub-routes and the riding habit information of the rider. In some embodiments, the predicted riding parameter of each of the sub-routes may include a predicted riding speed and a predicted motor assist parameter. Specifically, these sub-routes may include a first sub-route. Server device 100 may obtain a slope value of the first sub-route. The slope value of the first sub-route may be generated based on the elevation of the GPS location of the first sub-route. The server device 100 may determine the predicted riding speed corresponding to the first sub-route and the predicted motor assist parameter corresponding to the first sub-route based on the slope value of the first sub-route. In other words, the riding habit information of the rider may include riding speeds and motor assist parameters respectively corresponding to different slope values. Therefore, the server device 100 may search for the riding habit information according to the slope value of the first sub-route to obtain the corresponding predicted riding speed and the predicted motor assist parameter. Specifically, according to the riding habit information of the rider, the server device 100 may estimate the predicted riding speed of the electric-assisted bicycle 300 traveling along the first sub-route and the predicted motor assistance applied by the electric-assisted bicycle 300 based on the slope value of the first sub-route.

In step S443, the server device 100 may determine a segment riding time of each of the sub-routes based on the route information and the predicted riding parameter of each of the sub-routes. In some embodiments, the server device 100 may input the route information and the predicted riding parameter of the first sub-route into the machine learning model to generate the segment riding time of the first sub-route. It may be seen that the segment riding time of the first sub-route is positively correlated with the slope value of the first sub-route. The segment riding time of the first sub-route is positively correlated with the number of traffic lights of the first sub-route. Similarly, the server device 100 may use a machine learning model to estimate the segment riding time of each of the sub-routes. By using the slope value and the number of traffic lights of each of the sub-routes as input features of the machine learning model, the segment riding time of each of the sub-routes may be estimated more accurately. In addition, by using the predicted riding parameter generated based on the riding habit information as input features of the machine learning model, the segment riding time of each of the sub-routes may be estimated more accurately.

In addition, in some embodiments, the server device 100 may also estimate the output power of the motor 314 based on the predicted motor assist parameter among the predicted riding parameters and other motor parameters, and use the output power of the motor 314 as the input feature of the machine learning model to estimate the segment riding time of each of the sub-routes.

In step S444, the server device 100 may determine the riding time required for the electric-assisted bicycle 300 to travel along the planned route based on the segment riding time of each of the sub-routes. In some embodiments, the server device 100 may sum up the segment riding times of all sub-routes to obtain the riding time of the planned route.

In step S450, the server device 100 may estimate the power consumption of the electric-assisted bicycle 300 traveling along the planned route based on the riding time, route information and riding habit information. In some embodiments, step S450 may be implemented as step S451 to step S452.

In step S451, the server device 100 may determine the segment power consumption of each of the sub-routes based on the segment riding time of each of the sub-routes, the route information of each of the sub-routes, and the predicted riding parameter of each of the sub-routes. Specifically, in some embodiments, the server device 100 may input the route information of the first sub-route, the predicted riding parameter of the first sub-route and rider information to the machine learning model to determine the segment power consumption of the first sub-route. The above rider information may include the rider's weight. Similarly, the server device 100 may use a machine learning model to estimate the segment power consumption of each of the sub-routes.

In addition, in some embodiments, the server device 100 may also use the motor parameters of the motor 314 (such as the upper limit of the motor speed, etc.) as input features of the machine learning model to estimate the segment power consumption of each of the sub-routes. In some embodiments, the server device 100 may also estimate the output power of the motor 314 based on the predicted motor assist parameter in the predicted riding parameters and other motor parameters, and use the output power of the motor 314 as an input feature to estimate the segment consume power of each sub-route.

It may be seen that the segment power consumption of the first sub-route is positively correlated with the slope value of the first sub-route. The segment power consumption of the first sub-route is positively correlated with the number of traffic lights in the first sub-route. By using the slope value and the number of traffic lights of each of the sub-routes as input features of the machine learning model, the segment power consumption of each of the sub-routes may be estimated more accurately. In addition, by using the predicted riding parameters generated based on the rider's riding habit information as input features of the machine learning model, the segment power consumption of each of the sub-routes may be more accurately estimated.

In step S452, the server device 100 may determine the power consumption of the electric-assisted bicycle 300 traveling along the planned route based on the segment power consumption of each of the sub-routes. In some embodiments, the server device 100 may sum up the segment power consumptions of all sub-routes to obtain the total power consumption of the planned route.

In step S460, the electronic device 200 may display the riding time and the power consumption associated with the first riding mode through the user operation interface. In some embodiments, the electronic device 200 may compare the remaining power and the power consumption of the electric-assisted bicycle 300. The electronic device 200 may display a visual prompt through the user operation interface based on the comparison between the remaining power and the power consumption of the electric-assisted bicycle 300. For example, assuming that the remaining power of the electric-assisted bicycle 300 is 40% and the power consumption estimated by the server device 100 to travel the planned route in the first riding mode is 50%, The electronic device 200 can provide a visual alert indicating low battery level to the rider through the user operation interface.

Figure 5:
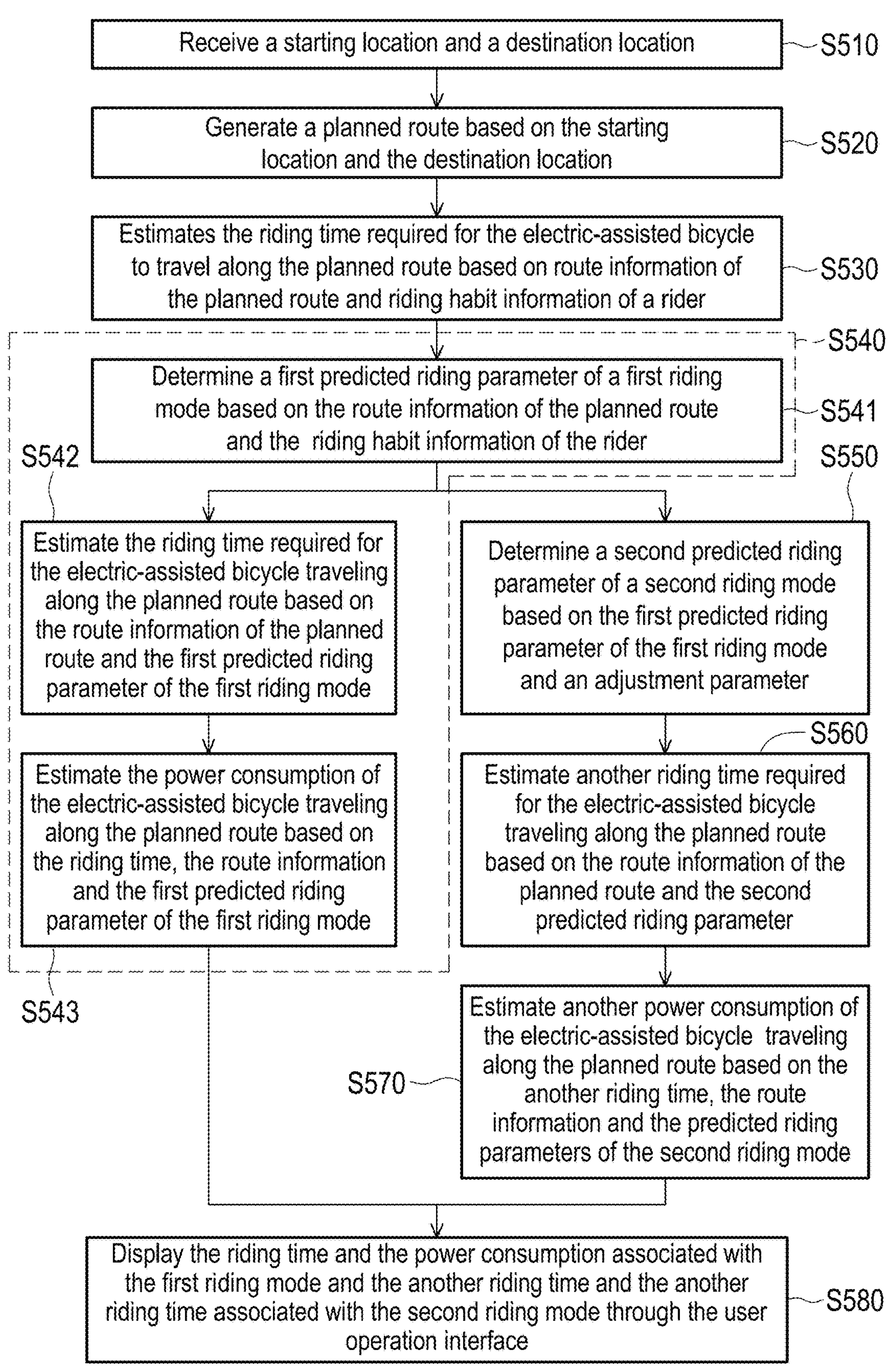
FIG. 5 is a flowchart of a method for estimating power consumption and time consumption of an electric-assisted bicycle according to an embodiment of the disclosure.

FIG. 5 is a flowchart of a method for estimating power consumption and time consumption of an electric-assisted bicycle according to an embodiment of the disclosure. Referring to FIG. 1 and FIG. 5, the method of the embodiment is applicable to the system 10 in the above embodiment. The following describes detailed steps of the embodiment in connection with various elements in the system 10.

It should be noted that, in some embodiments, the electric-assisted bicycle 300 may be set to different riding modes (also called power-assisted modes) to provide electric assistance required for different riding situations. For example, these riding modes may include power saving mode, normal mode, time saving mode, etc. These riding modes may correspond to different motor assist parameters. In some embodiments, the server device 100 may estimate power consumption and riding time for each riding mode.

In step S510, the server device 100 may collect the rider's riding habit information of the rider. In step S520, the server device 100 may receive a starting location and a destination location. In step S530, the server device 100 may generate a planned route based on the starting location and the destination location. Steps S510 to step S530 may be described with reference to the foregoing embodiments, and will not be described again here.

In step S540, the server device 100 may estimate a riding time and a power consumption of the electric-assisted bicycle 300 traveling the planned route based on the route information of the planned route and the riding habit information of the rider. In some embodiments, step S540 may be implemented as step S541 to step S542.

In step S541, the server device 100 may determine a first predicted riding parameter of the first riding mode based on the route information of the planned route and the riding habit information. The first predicted riding parameters may include a predicted riding speed and a predicted motor assist parameter. In step S542, the server device 100 may estimate the riding time required for the electric-assisted bicycle 300 traveling on the planned route based on the route information of the planned route and the first predicted riding parameter of the first riding mode. In step S543, the server device 100 may estimate the power consumption of the electric-assisted bicycle 300 traveling along the planned route based on the riding time and route information of the first riding mode and the first predicted riding parameter of the first riding mode. The server device 100 may estimate the riding time and the power consumption of the first riding mode based on multiple machine learning models that have been trained in advance.

In step S550, the server device 100 may determine a second predicted riding parameter of a second riding mode based on the first predicted riding parameter of the first riding mode and an adjustment parameter. The second predicted riding parameter may include predicted riding speed and predicted motor assist parameters. The adjustment parameter may be a proportional value.

For example, assuming that the first riding mode is the normal mode and the second riding mode is the power saving mode, the adjustment parameter is, for example, a proportion value less than 100% (such as 50%, 80%, etc.). By multiplying the default riding speed in the first predicted riding parameter by 80%, the server device 100 may obtain the default riding speed in the second predicted riding parameter. By multiplying the default motor assist parameter in the first predicted riding parameter by 50%, the server device 100 may obtain the default riding speed in the second predicted riding parameter.

For example, assuming that the first riding mode is the normal mode and the second riding mode is the time-saving mode, the adjustment parameter is, for example, a proportion value greater than 100% (such as 150%, 120%, etc.). By multiplying the default riding speed in the first predicted riding parameter by 150%, the server device 100 may obtain the default riding speed in the second predicted riding parameter. By multiplying the default motor assist parameter in the first predicted riding parameter by 120%, the server device 100 may obtain the default riding speed in the second predicted riding parameter.

In step S560, the server device 100 may estimate another riding time required for the electric-assisted bicycle 300 to travel along the planned route based on the route information of the planned route and the second predicted riding parameter. In step S570, the server device 100 may estimate another power consumption of the electric-assisted bicycle 300 traveling along the planned route based on the another riding time, the route information and the second predicted riding parameter. The estimation of riding time and power consumption in different riding modes are similar and can be referred to the implementation described above regarding the estimation of riding time and power consumption for the first riding mode. Therefore, it will not be elaborated here again.

At step S580, the electronic device 200 may display the riding time and the power consumption associated with the first riding mode through the user operation interface, and display another riding time and another power consumption associated with the second riding mode through the user operation interface. In this way, the rider may know the riding times and the power consumptions of different riding modes through the user operation interface.

Figure 6:
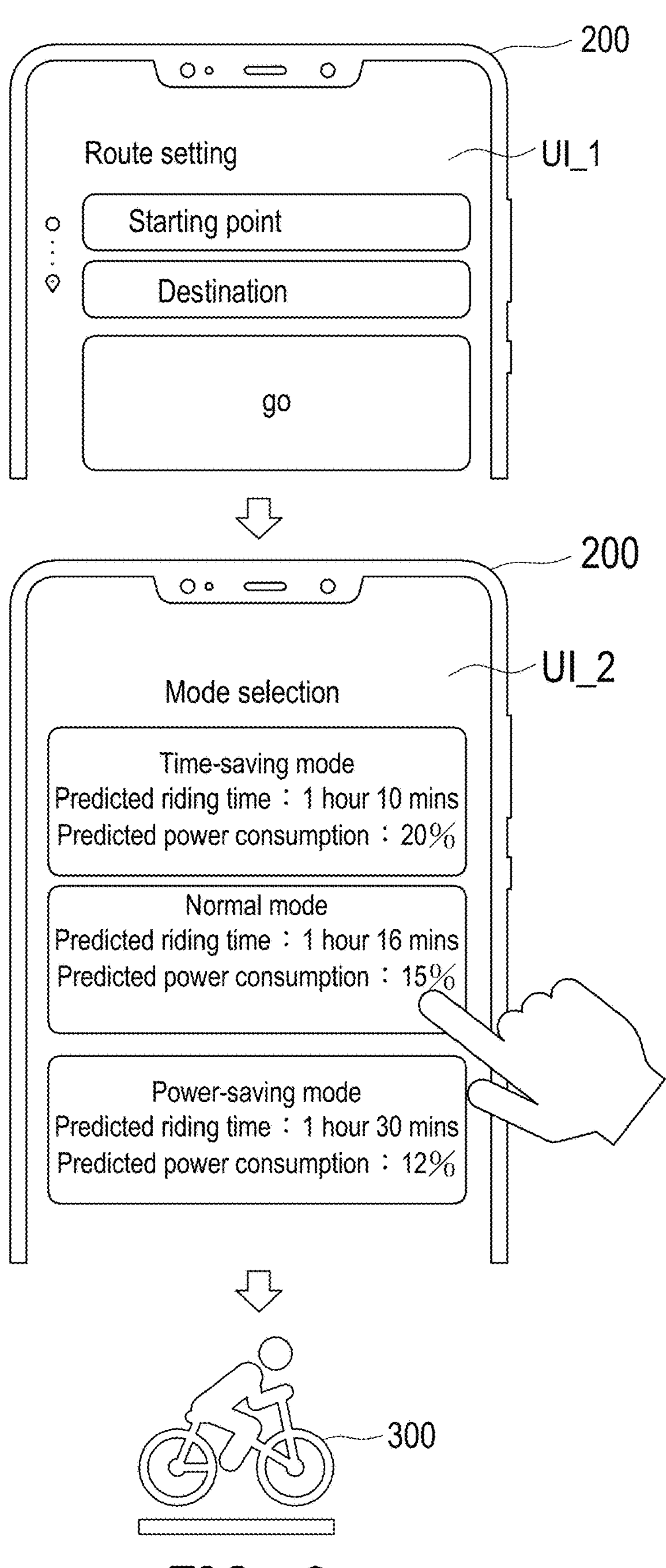
FIG. 6 is a schematic diagram of a user operation interface according to an embodiment of the disclosure.

FIG. 6 is a schematic diagram of a user operation interface according to an embodiment of the disclosure. Referring to FIG. 6, the rider may input the starting location and destination location in the user operation interface UI_1 of the electronic device 200. Next, it is assumed that the electric-assisted bicycle 300 has three riding modes, which are a time-saving mode, a normal mode, and a power-saving mode. The user operation interface UI_2 of the electronic device 200 may respectively display the power consumption and the riding time in the time-saving mode, the power consumption and the riding time in the normal mode, and the power consumption and the riding time in the power-saving mode. Afterwards, in response to the rider selecting the normal mode, the electric-assisted bicycle 300 may provide assistance according to the motor assistance parameters corresponding to the normal mode. In response to the rider selecting the power saving mode, the electric assisted bicycle 300 may provide assistance according to the motor assist parameters corresponding to the power saving mode.

Figure 7:
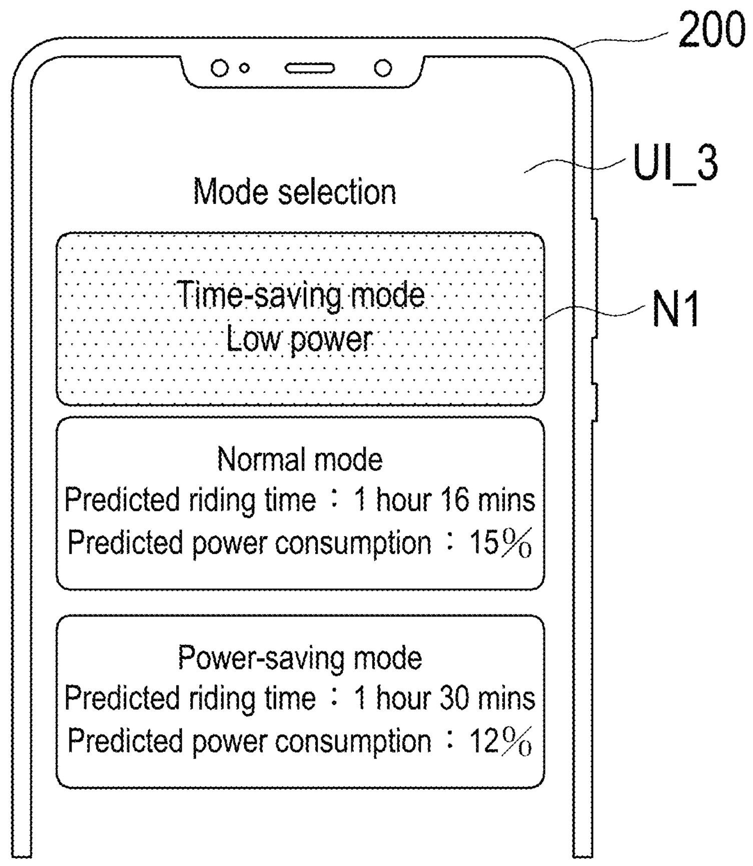
FIG. 7 is a schematic diagram of a user operation interface according to an embodiment of the disclosure.

FIG. 7 is a schematic diagram of a user operation interface according to an embodiment of the disclosure. Referring to FIG. 7, it is assumed that the electric-assisted bicycle 300 has three riding modes, which are a time-saving mode, a normal mode and a power-saving mode. The electronic device 200 may determine that the remaining power of the electric-assisted bicycle 300 is less than the power consumption of the time-saving mode. Thus, user operation interface UI_3 may provide a visual prompt for the time-saving mode. For example, a specific prompt color is displayed in the prompt box N2 in the time-saving mode or a prompt text indicating low battery is displayed.

To sum up, in the embodiment of the disclosure, the riding time and the power consumption of the electric-assisted bicycle traveling along the planned route may be accurately estimated based on the route information of the planned route and the rider's riding habit information. This allows the rider to know exactly whether the remaining battery power of the electric-assisted bicycle is sufficient. Based on this, riders may plan and arrange their riding plans more conveniently, while reducing the possibility of being unable to reach their destination effortlessly due to insufficient battery. In addition, the embodiments may estimate riding times and power consumptions for different riding modes, allowing riders to choose the riding mode of the electric-assist bicycle according to their actual needs. This further enhances the riding experience of the electric-assist bicycle.

What is claimed is:

1. A method for estimating power consumption and time consumption of a electric-assisted bicycles, comprising:

receiving a starting location and a destination location;

generating a planned route based on the starting location and the destination location;

estimating a riding time required for the electric-assisted bicycle to travel along the planned route based on route information of the planned route and riding habit information of a rider;

estimating a power consumption of the electric-assisted bicycle traveling along the planned route based on the riding time, the route information and the riding habit information; and displaying the riding time and the power consumption associated with a first riding mode through a user operation interface.

2. The method for estimating power consumption and time consumption of the electric-assisted bicycle according to claim 1, wherein the route information comprises a slope value and traffic light information.

3. The method for estimating power consumption and time consumption of the electric-assisted bicycle according to claim 1, further comprising:

collecting the riding habit information of the rider, wherein the riding habit information comprises a plurality of riding speeds respectively corresponding to a plurality of slope values and a plurality of motor assist parameters respectively corresponding to the slope values.

4. The method for estimating power consumption and time consumption of the electric assisted bicycle according to claim 1, wherein the step of estimating the riding time required for the electric-assisted bicycle to travel along the planned route based on the route information of the planned route and the riding habit information of the rider comprises:

dividing the planned route into a plurality of sub-routes;

determining a predicted riding parameter of each of the sub-routes in the first riding mode based on the route information of each of the sub-routes and the riding habit information of the rider;

determining a segment riding time of each of the sub-routes based on the route information of each of the sub-routes and the predicted riding parameter of each of the sub-routes; and determining the riding time required for the electric-assisted bicycle to travel along the planned route based on the segment riding time of each of the sub-routes.

5. The method for estimating power consumption and time consumption of the electric assisted bicycle according to claim 4, wherein the sub-routes comprise a first sub-route, and the step of determining the predicted riding parameter of each of the sub-routes in the first riding mode based on the route information of each of the sub-routes and the riding habit information of the rider comprises:

obtaining a slope value of the first sub-route; and determining a predicted riding speed corresponding to the first sub-route and a predicted motor assist parameter corresponding to the first sub-route according to the slope value of the first sub-route.

6. The method for estimating power consumption and time consumption of the electric assisted bicycle according to claim 4, wherein the sub-routes comprise a first sub-route, and the step of determining the segment riding time of each of the sub-routes based on the route information of each of the sub-routes and the predicted riding parameter of each of the sub-routes comprises:

inputting the route information and the predicted riding parameter of the first sub-route into a machine learning model to generate the segment riding time of the first sub-route.

7. The method for estimating power consumption and time consumption of the electric assisted bicycle according to claim 4, wherein the step of estimating the power consumption of the electric-assisted bicycle traveling along the planned route based on the riding time, the route information and the riding habit information comprises:

determining a segment power consumption of each of the sub-routes based on the segment riding time of each of the sub-routes, the route information of each of the sub-routes, and the predicted riding parameter of each of the sub-routes; and determining the power consumption of the electric-assisted bicycle traveling along the planned route based on the segment power consumption of each of the sub-routes.

8. The method for estimating power consumption and time consumption of electric assisted bicycles according to claim 7, wherein the sub-routes comprise a first sub-route, and the step of determining the segment power consumption of each of the sub-routes based on the segment riding time of each of the sub-routes, the route information of each of the sub-routes, and the predicted riding parameter of each of the sub-routes comprises:

inputting the route information and the predicted riding parameter of the first sub-route and a rider information into a machine learning model to determine the segment power consumption of the first sub-route.

9. The method for estimating power consumption and time consumption of the electric-assisted bicycle according to claim 1, further comprising:

determining a first predicted riding parameter of the first riding mode based on the route information of the planned route and the riding habit information of the rider;

determining a second predicted riding parameter of a second riding mode based on the first predicted riding parameter of the first riding mode and an adjustment parameter, wherein the second predicted riding parameter comprises a predicted riding speed and a predicted motor assist parameter;

estimating another riding time required for the electric-assisted bicycle to travel along the planned route based on the route information of the planned route and the second predicted riding parameter;

estimating another power consumption of the electric-assisted bicycle traveling along the planned route based on the another riding time, the route information and the second predicted riding parameter of the second riding mode;

displaying the riding time and the power consumption associated with the first riding mode and the another riding time and the another riding time associated with the second riding mode through the user operation interface.

10. The method for estimating power consumption and time consumption of the electric-assisted bicycle according to claim 1, further comprising:

comparing remaining power of the electric-assisted bicycle with the power consumption; and displaying a visual prompt through the user operation interface according to the comparison result between the remaining power of the electric-assisted bicycle and the power consumption.

11. A system for estimating power consumption and time consumption of a electric-assisted bicycle, comprising:

a storage device; and a processor coupled to the storage device and configured to:

receive a starting location and a destination location;

generate a planned route based on the starting location and the destination location;

estimate a riding time required for the electric-assisted bicycle to travel along the planned route based on route information of the planned route and riding habit information of a rider;

estimate a power consumption of the electric-assisted bicycle traveling along the planned route based on the riding time, the route information and the riding habit information; and display the riding time and the power consumption associated with a first riding mode through a user operation interface.

12. The system for estimating power consumption and time consumption of the electric-assisted bicycle according to claim 11, wherein the route information comprises a slope value and traffic light information.

13. The system for estimating power consumption and time consumption of the electric-assisted bicycle according to claim 11, wherein the processor is configured to:

collect the riding habit information of the rider, wherein the riding habit information comprises a plurality of riding speeds respectively corresponding to a plurality of slope values and a plurality of motor assist parameters respectively corresponding to the slope values.

14. The system for estimating power consumption and time consumption of the electric assisted bicycle according to claim 11, wherein the processor is configured to:

divide the planned route into a plurality of sub-routes;

determine a predicted riding parameter of each of the sub-routes in the first riding mode based on the route information of each of the sub-routes and the riding habit information of the rider;

determine a segment riding time of each of the sub-routes based on the route information of each of the sub-routes and the predicted riding parameter of each of the sub-routes; and determine the riding time required for the electric-assisted bicycle to travel along the planned route based on the segment riding time of each of the sub-routes.

15. The system for estimating power consumption and time consumption of the electric assisted bicycle according to claim 14, wherein the sub-routes comprise a first sub-route, and the processor is configured to:

obtain a slope value of the first sub-route; and determine a predicted riding speed corresponding to the first sub-route and a predicted motor assist parameter corresponding to the first sub-route according to the slope value of the first sub-route.

16. The system for estimating power consumption and time consumption of the electric assisted bicycle according to claim 14, wherein the sub-routes comprise a first sub-route, and the processor is configured to:

input the route information and the predicted riding parameter of the first sub-route into a machine learning model to generate the segment riding time of the first sub-route.

17. The system for estimating power consumption and time consumption of the electric assisted bicycle according to claim 14, wherein the processor is configured to:

determine a segment power consumption of each of the sub-routes based on the segment riding time of each of the sub-routes, the route information of each of the sub-routes, and the predicted riding parameter of each of the sub-routes; and determine the power consumption of the electric-assisted bicycle traveling along the planned route based on the segment power consumption of each of the sub-routes.

18. The system for estimating power consumption and time consumption of electric assisted bicycles according to claim 17, wherein the sub-routes comprise a first sub-route, and the processor is configured to:

input the route information and the predicted riding parameter of the first sub-route and a rider information into a machine learning model to determine the segment power consumption of the first sub-route.

19. The system for estimating power consumption and time consumption of the electric-assisted bicycle according to claim 11, wherein the processor is configured to:

determine a first predicted riding parameter of the first riding mode based on the route information of the planned route and the riding habit information of the rider;

determine a second predicted riding parameter of a second riding mode based on the first predicted riding parameter of the first riding mode and an adjustment parameter, wherein the second predicted riding parameter comprises a predicted riding speed and a predicted motor assist parameter;

estimate another riding time required for the electric-assisted bicycle to travel along the planned route based on the route information of the planned route and the second predicted riding parameter;

estimate another power consumption of the electric-assisted bicycle traveling along the planned route based on the another riding time, the route information and the second predicted riding parameter of the second riding mode;

display the riding time and the power consumption associated with the first riding mode and the another riding time and the another riding time associated with the second riding mode through the user operation interface.

20. The method for estimating power consumption and time consumption of the electric-assisted bicycle according to claim 11, wherein the processor is configured to:

compare remaining power of the electric-assisted bicycle with the power consumption; and display a visual prompt through the user operation interface according to the comparison result between the remaining power of the electric-assisted bicycle and the power consumption.

* * * * *